US012810707B2

(12) United States Patent
Leboeuf et al.

(10) Patent No.: US 12,810,707 B2
(45) **Date of Patent: *Nov. 24, 2026**

(54) TAMPER SENSOR FOR 3-DIMENSIONAL DIE STACK

(71) Applicant: XILINX, INC., San Jose, CA (US)

(72) Inventors: Thomas Paul Leboeuf, Sandia Park, NM (US); James Anderson, Madison, AL (US); James D. Wesselkamper, Albuquerque, NM (US); Jason J. Moore, Albuquerque, NM (US)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/251,447

(22) Filed: Jun. 26, 2025

(65) Prior Publication Data

US 2025/0329237 A1 Oct. 23, 2025

Related U.S. Application Data

(63) Continuation of application No. 18/374,639, filed on Sep. 28, 2023, now Pat. No. 12,361,808.

(51) Int. Cl.

| | |
|---|---|
| ***G08B 13/22*** | (2006.01) |
| ***G11C 19/28*** | (2006.01) |
| ***H10B 80/00*** | (2023.01) |
| ***H10W 90/00*** | (2026.01) |
| *H10W 20/20* | (2026.01) |

(Continued)

(52) U.S. Cl.

CPC ............ *G08B 13/22* (2013.01); *G11C 19/287* (2013.01); *H10B 80/00* (2023.02); *H10W 90/00* (2026.01); *H10W 20/20* (2026.01); *H10W 72/07254* (2026.01); *H10W 72/247* (2026.01); *H10W 90/722* (2026.01); *H10W 90/724* (2026.01)

(58) Field of Classification Search

CPC ....... G08B 13/22; H10B 80/00; H10W 90/00; H10W 20/20; H10W 72/07254; H10W 90/724; H10W 72/247; H10W 90/722; G11C 19/287

USPC ........................................................ 340/635

See application file for complete search history.

(56) References Cited

U.S. PATENT DOCUMENTS

2011/0031982 A1* 2/2011 Leon .................. H10W 42/405 361/783

2013/0235544 A1* 9/2013 Tucker ................. H10W 20/20 174/262

(Continued)

OTHER PUBLICATIONS

U.S. Appl. No. 17/985,736, filed Nov. 11, 2022 Entitled “Integrated Circuit Protection Using Stacked Dies”.

(Continued)

*Primary Examiner* — Kerri L Mcnally

(74) *Attorney, Agent, or Firm* — Patterson + Sheridan, LLP

(57) ABSTRACT

An integrated circuit die stack and method thereof are described herein that is capable of detecting a physical tampering event. The integrated circuit die stack includes a first integrated circuit die including a sensor network that extends substantially across an entire top surface of the first integrated circuit die, and a second integrated circuit die stacked below the first integrated circuit die. The second integrated circuit die is configured to receive sensing signals (Continued)

generated by the sensor network via a plurality of through-silicon-vias coupled with the first integrated circuit die and the second integrated circuit die.

20 Claims, 8 Drawing Sheets

(51) Int. Cl.
*H10W 72/00* (2026.01)
*H10W 72/20* (2026.01)

(56) References Cited

U.S. PATENT DOCUMENTS

| | | | | |
|---|---|---|---|---|
| 2015/0137340 | A1* | 5/2015 | Buer | G06F 21/87 257/690 |
| 2016/0315055 | A1* | 10/2016 | Vogt | H10W 42/20 |
| 2016/0357177 | A1 | 12/2016 | Chand et al. | |
| 2018/0061196 | A1* | 3/2018 | Busby | G08B 13/12 |
| 2019/0205244 | A1* | 7/2019 | Smith | G06F 3/065 |
| 2021/0124711 | A1 | 4/2021 | Ansari et al. | |
| 2021/0242185 | A1* | 8/2021 | Yazdani | H10W 40/10 |

OTHER PUBLICATIONS

Zhou, K., et al., "FPGA-based RO PUF with low overhead and high stability." Electron. Lett., 55: 510-513, 2019, https://doi.org/10.1049/el.2019.0451.

Hertz, Jake, "An Introduction to Physically Unclonable Functions," All About Circuits, Jun. 14, 2021, https://www.allaboutcircuits.com/technical-articles/an-introduction-to-physically-unclonable-functions/.

Invia, "Understanding Physical Unclonable Function (PUF)," Design &Reuse, Mar. 23, 2020, https://www.design-reuse.com/articles/47717/understanding-physical-unclonable-function-puf.html.

Sardar, Zia, "Cryptography: Understanding the Benefits of the Physically Unclonable Function (PUF)," Maxim Integrated, APP 7629, Jun. 15, 2020, https://www.maximintegrated.com/en/design/technical-documents/tutorials/7/7269.html.

International Search Report and Written Opinion for PCT/US2024/044804 dated Dec. 6, 2024.

* cited by examiner

TAMPER SENSOR FOR 3-DIMENSIONAL DIE STACK

CROSS REFERENCE TO RELATED APPLICATION

This application is a continuation of U.S. Non-Provisional application Ser. No. 18/374,639, filed on Sep. 28, 2023 of which is incorporated herein by reference in its entirety.

TECHNICAL FIELD

Embodiments of the present invention generally relate to an integrated circuit die stack capable of sensing a tampering event, and, in particular, to an integrated circuit die stack that utilizing a network of addressable memories to sense a tampering event.

BACKGROUND

Electronic devices, such as tablets, computers, copiers, digital cameras, smart phones, control systems and automated teller machines, among others, often leverage chip package assemblies for increased functionality. To increase processing capabilities, chip packaging schemes often form a die stack by vertically mounting a plurality of integrated circuit dies to a package substrate. These integrated circuit die stack may include memory, logic, communication, power management, or other functions.

Recently, physical attacks have been tested to gain access to internal data and algorithms of stacked integrated circuit dies. These physical attacks take advantages of backside access to perform laser attacks, focused ion beam attacks, and other tampering activities. A physical access is generally required for this class of tampering attempts. Coincidently, recent developments of chips with thinner substrates and active-on-active stacked die architectures have added more challenges to thwart the above mentioned physical attacks.

Thus, there is a need for an integrated circuit die stack with an improved security.

SUMMARY

An integrated circuit die stack and method thereof are described herein that is capable of detecting a physical tampering event. The integrated circuit die stack includes a first integrated circuit die including a sensor network that extends substantially across an entire top surface of the first integrated circuit die, and a second integrated circuit die stacked under the first integrated circuit die. The second integrated circuit die is configured to receive sensing signals generated by the sensor network via a plurality of through-silicon-vias coupled with the first integrated circuit die and the second integrated circuit die. The method includes inputting a probing signal from a second integrated circuit die to a sensor network disposed on a first integrated circuit die, the first integrated circuit die comprising an input/output interface disposed around a peripheral area of the first integrated circuit die; injecting the probing signal through a plurality of addressable memories of the sensor network; reading, by the input/output interface, a sensing signal output by the plurality of addressable memories based on the probing signal; and providing the sensing signal to the second integrated circuit die via a plurality of through-silicon-vias, the second integrated circuit die stacked under the first integrated circuit die and configured to determine a tampering event based on the sensing signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Disclosed herein are an integrated circuit (IC) die stack that is capable of detecting physical attacks designed to gain access to internal data or circuitry. The IC die stack includes a sensing IC die having a sensor network and disposed above a to-be-protected proprietary IC die. The sensor network of the sensing IC die includes an array of addressable memories covering the sensing IC die. Circuitries that dictate the functions of the sensing IC die may be disposed at a base IC die that is disposed below the sensing IC die. The sensing IC die, the proprietary IC die, and base IC die are coupled via a plurality of through-silicon-vias.

A probing signal originates from the base IC die and transmitted to the sensor network, which routes the probing signal via the addressable memories and outputs a sensing signal to a reading circuit. The sensing signal indicates whether an addressable memory is functioning properly or not. When any one of the addressable memory is tampered by a physical attack, the sensing signal will indicate a malfunction of that addressable memory. The sensing signal also includes suitable addresses corresponding to a breached memory. Proper security actions may be taken after the breached memory is determined. The detection of the breached memory may be implemented when the IC die stack is rebooted or during a runtime.

The sensing IC die may use a plurality of shift registers as the addressable memories. The plurality of shift registers as set forth in the present application can be implemented without substantially increasing the manufacturing cost and can detect a physical tampering efficiently without causing any substantial delay of other functions of an IC die stack.

Figure 1:
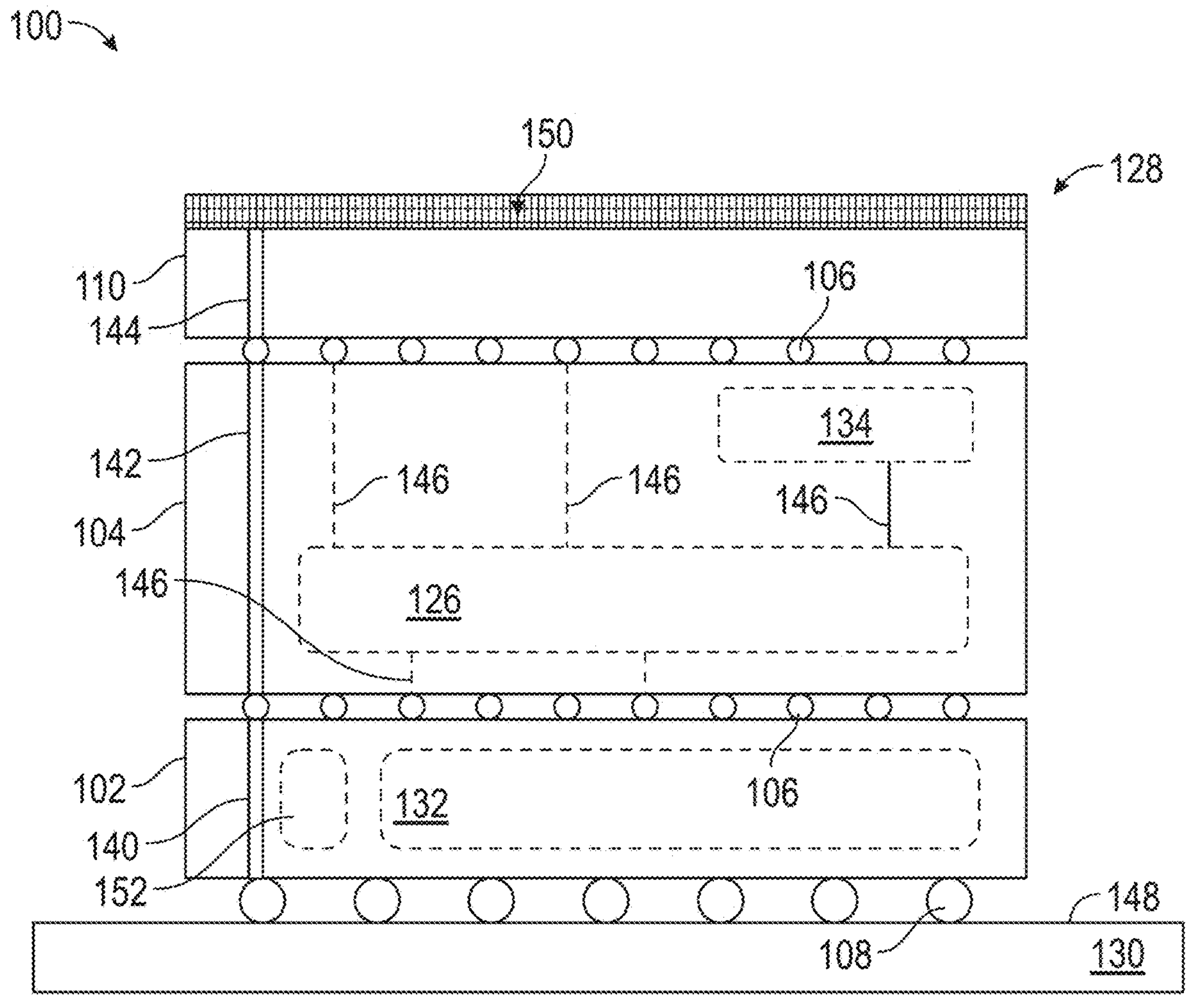
FIG. 1 is a schematic cross-sectional view of an integrated chip package having stacked integrated circuit dies, according to an embodiment.

Turning now to FIG. 1, an exemplary integrated chip package 100 is schematically illustrated having an IC die stack 128 disposed on a package substrate 130. The chip package 100 may be mounted to a printed circuit board (not shown) together form at least part of an electronic device. The electronic device may be a tablet, computer, copier, digital camera, smart phone, control system, automated teller machine, server or other solid-state memory and/or logic device.

The IC die stack 128 is mechanically and electrically coupled to a top surface 148 of the package substrate 130 via solder balls 108 or other suitable connection. The solder balls 108 enable data, power and ground signals to be transferred between the circuitry of the IC die stack 128 and the routings of the package substrate 130.

The IC die stack 128 includes a plurality of IC dies, such as a bottom die 102, a middle die 104, and a top die 110. The plurality of IC dies are connected by an interface 106 that enable data, power, and ground signals to be transferred among the plurality of IC dies. According to an embodiment, the top die 110 is capable of detecting a tampering event according to various embodiments as set forth in the present application. The top die 110 includes a sensor network 150 for detecting a physical attack. The middle die 104 is disposed between the top die 110 and the bottom die 102 and includes functional circuitries 126 and 134, such as an encryption circuitry or a storage circuitry, which need protection. The bottom die 102 may also include functional circuitries 132 and 152 that are similar as circuitries in the middle die 104. The IC die stack 128 also includes a plurality of through-silicon-vias (“TSA”) 140, 142, 144 that interconnect the plurality of IC dies 102, 104, and 110 and are configured to provide data communication or power among the plurality of IC dies.

According to an embodiment, probing signals generated by a functional circuitry 152 of the bottom die 102 are transmitted to the top die 110 by TSAs 144, 142, and 140. Subsequently, sensing signals generated by the top die 110 are transmitted by TSAs 144, 142, and 140 to the function circuitry 152 of the bottom die 102. The functional circuitry 152 analyzes the sensing signals to obtain information about a physical tamper. The information may indicate whether a tampering event has occurred and a location of the tampering event. The top die 110 and the functional circuitry 152 at the bottom die 102 form a tamper sensing system for sensing a physical attack to the IC die stack 128. It is noted that the bottom die 102 may include functional circuitries 132 for other functions, such as encryption, communication, or graphic processing, among others.

An attempt to physically attack any IC dies of the IC die stack 128 can be discovered by the top die 110. The top die 110 may report the occurrence of the physical attack to a higher level controller so that proper actions can be taken to mitigate the security risks caused by the physical attack. Alternatively or in addition, the top die 110 may include circuitries that can mitigate the risk of a physical breach of the IC die stack 128. In this way, the top die 110 protects at least one IC die of the IC die stack 128 that is below the top die 110, such as the middle die 104 and/or the bottom die 102 or another other IC die(s) below the top die 110. As contemplated by the present disclosure, the top die 110 represents an IC die that is disposed above a protected IC die and needs not to be the topmost die in the IC die stack 128. According to an embodiment, the IC die stack 128 may include additional IC dies above the top IC die 110. According to another embodiment, the top die 110 represents the topmost layer of the IC die stack 128.

As shown in FIG. 1, the top die 110 includes a sensor network 150 configured to detect a tampering event with the IC die stack 128. The sensor network 150 extends substantially across an entire layer (in the horizontal plane that is parallel to the top surface) of the top die 110 such that a physical attack at any location at the top surface of the top die 110 can be detected. The sensor network 150 is also configured to generate signals that indicate an approximate location of the physical attack. The sensor network 150 includes an array of addressable memories. According to an embodiment, the array of addressable memories are reconfigurable to enhance the robustness of the sensing method. In an embodiment, the analyzing circuit for determining a physical attack, such as the circuitry 152, is separated from the top die 110 and disposed at the bottom die 102, which further enhances the security of this tamper sensing system.

The bottom IC die 102 is mounted to the top surface 148 of the package substrate 130. The bottom IC die 102 is mechanically and electrically coupled to the middle IC die 104 via the interface 106. The interface 106 may be comprised of a plurality of solder connections. Alternatively, the interface 106 may be a solderless bond between the IC dies 102, 104. The functional circuitries 126 and 134 are coupled with the interface 106 via routings 146.

FIG. **2*a* illustrates schematic functional blocks of the top die 110, according to an embodiment. The top die 110 includes the sensor network 150 and an input/output interface 202. The sensor network 150 includes an array of sensors that are integrated with the top die 110** and configured to generate sensing signals indicating whether a physical attack to the sensor network has occurred. According to an embodiment, the sensing signals include information indicating a location of the physical attack. The sensors can be any suitable sensors that are capable of generating distinguishable signals when an attack has occurred. The sensors may be capacitive sensors, impedance sensors, optical sensors, circuitries, or any other suitable sensors.

Figure 3:
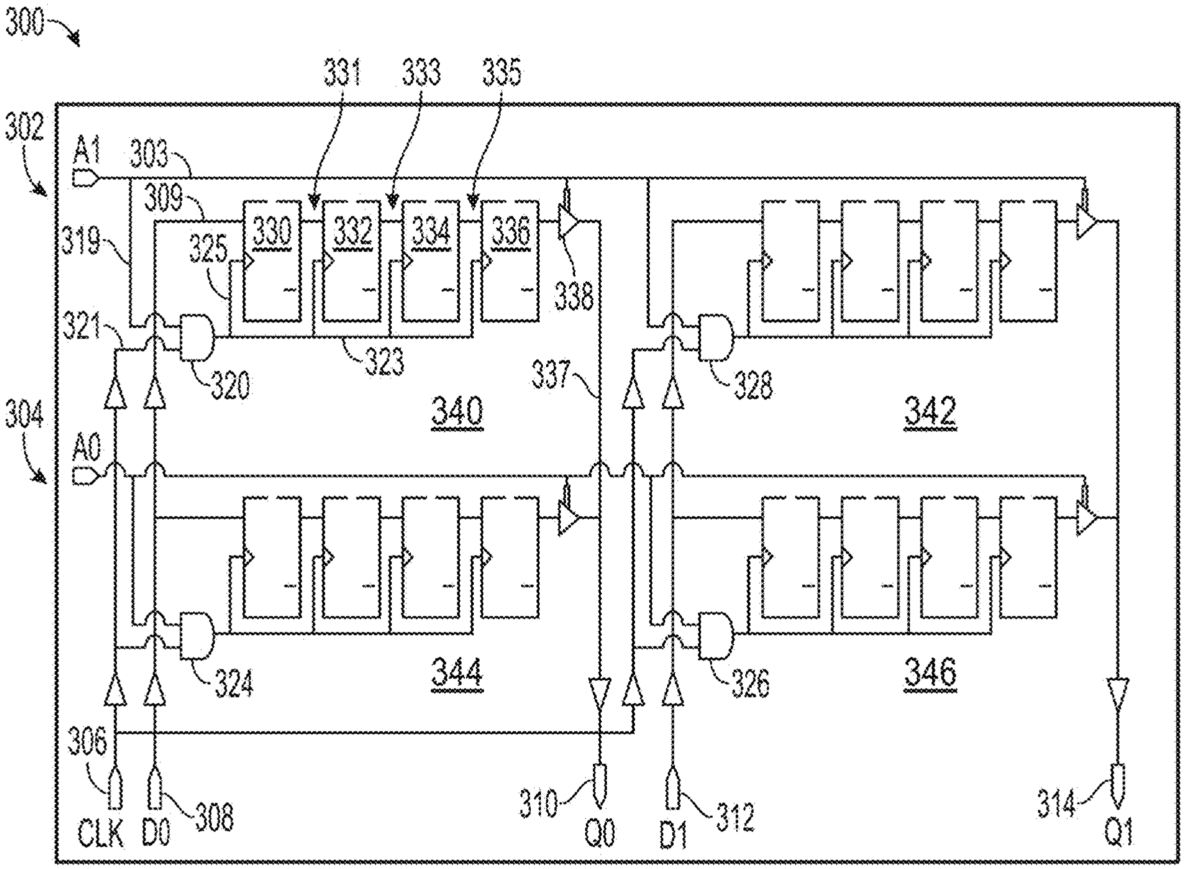
FIG. 3 is a schematic circuit diagram of an addressable memory of the sensor network, according to an embodiment.

According to an embodiment, the sensors may include integrated memory banks, such as memory banks A-Y as shown in FIG. 3. The plurality of memory banks A-Y are interconnected. According to an embodiment, the memory banks disposed in a same row or column are serially connected such that a sensed signal of one memory bank can be promulgated to all other downstream memory banks. For example, when the rightmost column 212 in FIG. **2*a* includes memory banks E, J, O, T, and Y that are serially connected. When the memory bank E receives a probing signal 214, the memory bank E generates a sensing signal 216 and outputs the sensing signal 216 to the memory bank J, which in turn outputs a sensing signal to the memory bank O. When the memory bank E is breached due to a physical attack, the memory bank E outputs an irregular sensing signal 216** that will be sensed by the memory banks J, O, T, and Y.

The input/output interface 202 is disposed at a peripheral area 204 of the top die 110. According to an embodiment, the input/output interface 202 includes a plurality of column addresses C1 . . . C5 and row addresses R1 . . . R5. The sensor network 150 attaches the column addresses and row addresses to output signals of each memory bank to indicate the location of the output signals. According to another embodiment, each addressable memory has an inherent address, and the inherent address is attached to signals output by that addressable memory. A map showing the inherent addresses of the addressable memory banks and their corresponding physical locations may also be stored in other parts of the IC die stack 128, such as the input/output interface 202 of the top die 110, the bottom die 102, or other suitable parts.

Figure 2A:
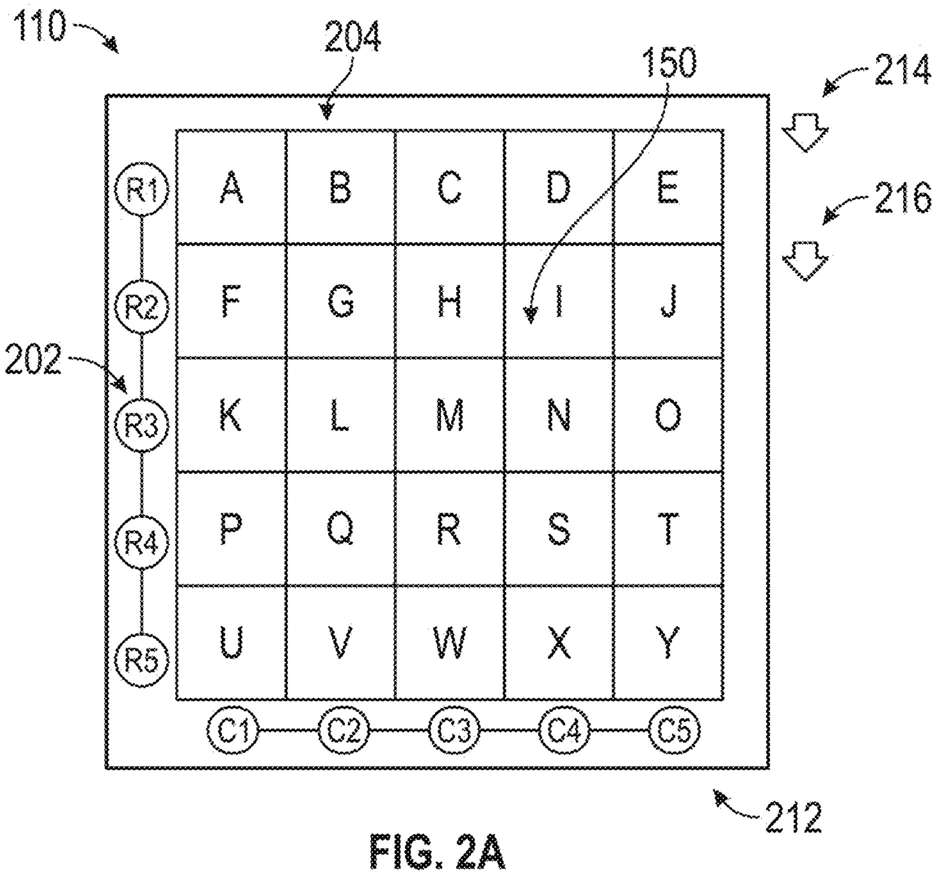
FIG. 2*a* is a schematic illustrations of functional blocks of a top integrated circuit die having a sensor network, according to an embodiment.
Figure 2B:
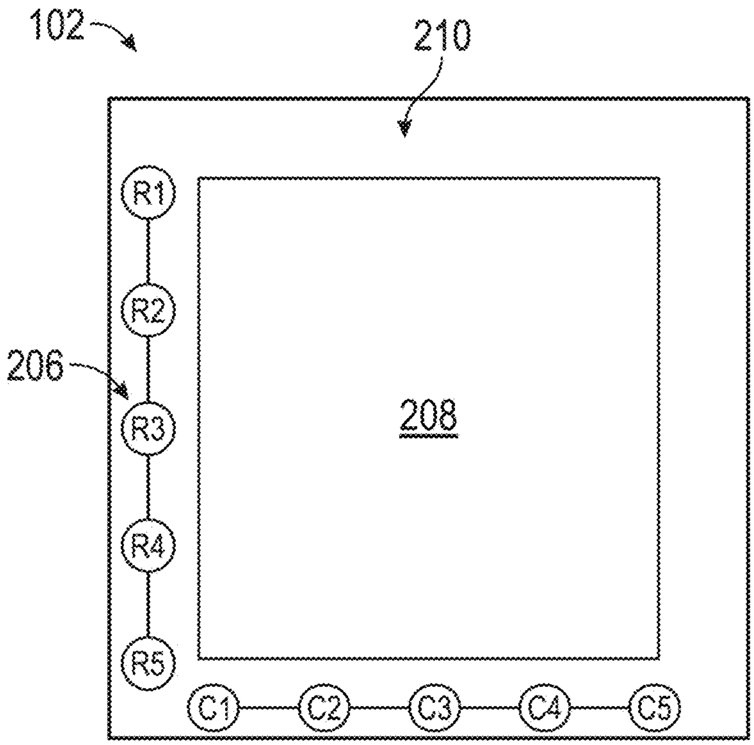
FIG. 2*b* is a schematic illustrations of functional blocks of a bottom integrated circuit die having a sensor network, according to an embodiment.

FIG. 2*b* illustrates schematic functional blocks of the bottom die 102, according to an embodiment. The bottom die 102 includes a central area 208 configured to hold a plurality of circuitries supporting functions of the IC die stack 128. The bottom die 102 further includes an input/output interface 206 disposed in a peripheral area 210 of the bottom die 102. According to an embodiment, the peripheral area 210 and the peripheral area 204 are coupled via the plurality of through-silicon-vias 140, 142, and 144 (FIG. 1). The peripheral area 210 and the peripheral area 204 may have similar dimensions and have identical addresses of the memory banks. According to an embodiment, the bottom die 102 generates a probing signal and transmits the probing signal from the input/output interface 206 to the input/output interface 202 of the top die 110 via the plurality of through-silicon-vias 140, 142, and 144. The sensor network 150 processes the probing signal and generates a plurality of sensing signals via the memory banks A-Y. The sensor network 150 further transmits the sensing signals from the input/output interface 202 to the input/output interface 206 via the plurality of through-silicon-vias 140, 142, and 144. In this manner, a plurality of sensing loops have been formed between the top die 110 and the bottom die 102.

The placement of the input/output interface 202 in the peripheral area 204 allows the present detecting system to be agnostic to different types of to-be-protected dies as functional circuitries are typically disposed within central areas of an integrated circuit die.

FIG. 3 illustrates a schematic circuit diagram of an integrated memory bank, according to an embodiment. The circuit diagram 300 may be implemented as any one of the memory banks A-Y of FIG. 2*a*. According to an embodiment, the circuit diagram 300 includes four similar subsections 340, 342, 344, and 346, each representing a shift register. The four subsections 340, 342, 344, and 346 are connected in parallel and are synchronized by sharing a common clock signal CLK 306. The four subsections 340, 342, 344, and 346 are configured to process input signals A1 302, A0 304, DO 308, and D1 312. The input signals A1 302 and A0 304 may represent activation signals to activate the subsections. The input signals DO 308 and D1 312 may represent data included in a probing signal. The four subsections 340, 342, 344, and 348 are configured to process input signals DO 308 and D1 312 according to the clock signal CLK 306 and the activation signals A1 33 and A0 304. For example, subsection 340 processes the data signal DO 308 according to the activation signal A1 302 and the clock signal CLK 306; subsection 342 processes the data signal D1 312 according to the activation signal A1 302 and the clock signal CLK 306; subsection 344 processes the data signal DO 308 according to the activation signal A0 304 and the clock signal CLK 306; and subsection 346 processes the data signal D1 312 according to the activation signal A0 304 and the clock signal CLK 306.

Each subsection 340, 342, 344, and 346 may provide at least one output signal. The output signals by subsections 340 and 344 are combined to generate the first output signal Q0 310, and the output signals by the subsections 342 and 346 are combined to generate the second output signal Q1 314. The first output signal Q0 310 and the second output signal 314 form a part of the sensing signals of the sensor network 150.

According to an embodiment, the data signals DO and D1 may be used to input probing signals from opposite directions. The plurality of subsections provide sensing redundancy to avoid false positives in detecting physical attacks. The activation signals A0 and A1 may be used to selectively activate the subsections.

Now with reference to subsection 340, the detailed circuit diagram of each subsection will be described. Subsection 340 represents a 4-bit shift register and includes four (4) 4 flip-flops 330, 332, 334, and 336 that are serially connected. The four (4) flip-flops may be D flip-flops. The flip-flops 330, 332, 334, and 336 are synchronized and share a common clock signal 323. An AND gate 320 includes a first terminal 319 that receives the activation signal A1 302 and a second terminal 321 that receives the clock signal CLK 306. The AND gate 320 outputs the common clock signal 323 to the clock terminals 325 of the flip-flops 330, 332, 334, and 336. The data signal DO 308 is provided to the data terminal 309 of the first flip-flop 330. The flip-flops 330, 332, and 334 outputs signals 331, 333, and 335, respectively, which are provided to the data terminal of the next flip-flop. The output of the last flip-flop 336 is provided to a tri-state buffer 338 with the activation signal A1 302 as the control input. The tri-state buffer 338 provides the output signal 337 when the activation signal A1 302 is activated.

Figure 4A:
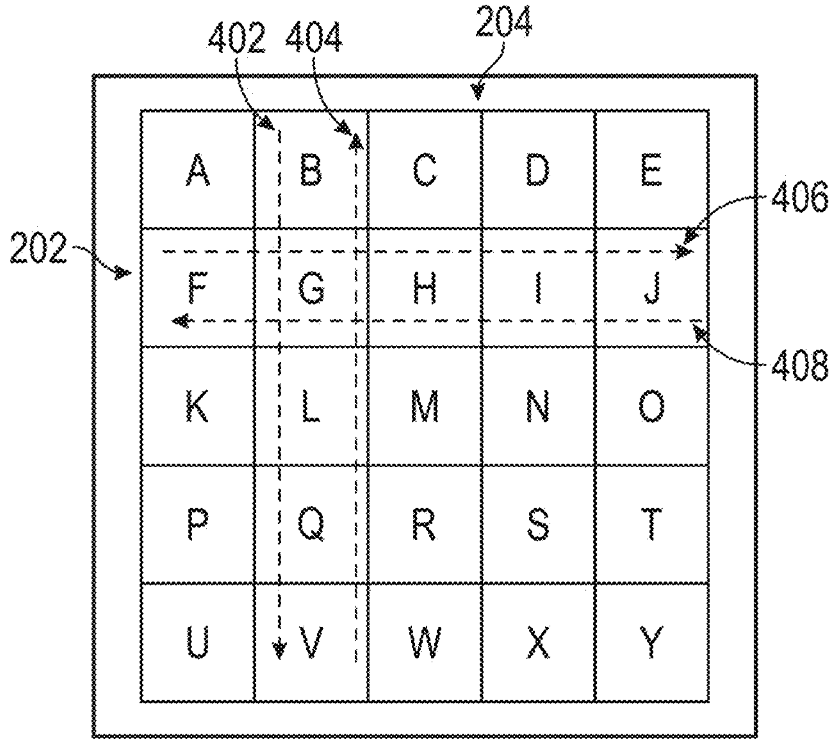
FIG. 4*a* is a schematic signal path of the top integrated circuit die, according to an embodiment.

FIG. 4*a* illustrates a schematic signal path of the top die 110, according to an embodiment. According to an embodiment, the input/output interface 202 of the top die 110 is configured to inject probing signals in opposite directions, such as upward and downward directions 402 and 404 or leftward and rightward directions 406 and 408. The input/output interface 202 is also configured to read a sensing signal generated by a memory bank in opposite directions, such as the same upward and downward directions 402 and 404 or the same leftward and rightward directions 406 and 408.

Figure 4B:
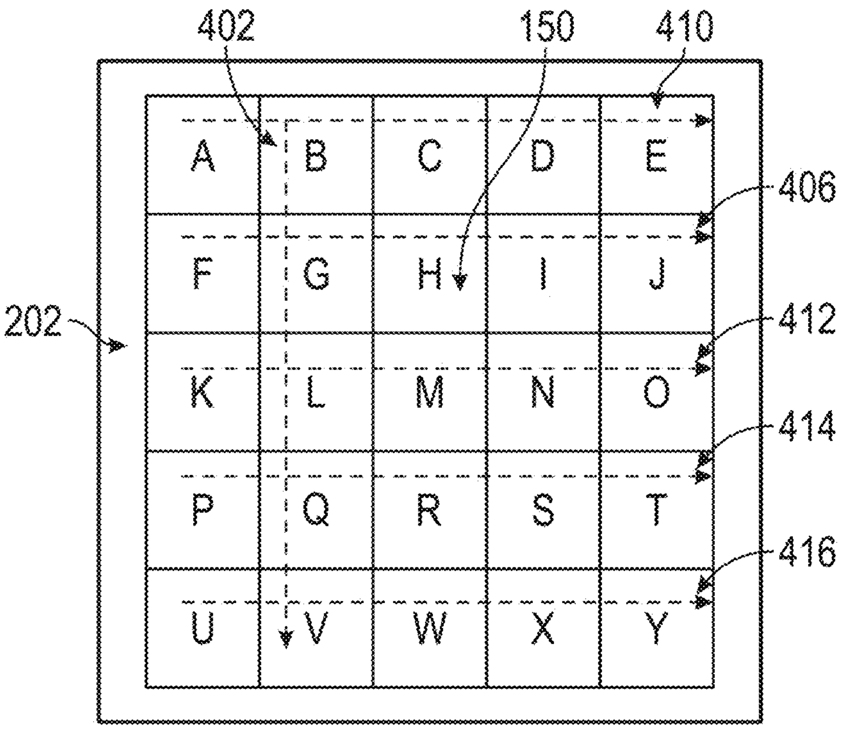
FIG. 4*b* is another schematic signal path of the top integrated circuit die, according to an embodiment.

FIG. 4*b* illustrates a schematic data path of the sensor network 150, according to an embodiment. The input/output interface 202 injects a probing signal to the column including the memory banks B, G, L, Q, and V. The probing signal transmits from the top memory bank B to the bottom memory bank V. The input/output interface 202 also reads the sensing signals generated by each memory bank in a plurality of orthogonal directions 410, 406, 412, 414 and 416. Assuming that memory bank G has been subjected to physical attacks, the sensing signal generated by the memory Bank G will spread into the sensing signals of memory banks L, Q, and V. When data injection and signal reading occur in both directions, a compromised memory bank can be sensed by almost every reading register in the input/output interface 202.

Figure 5:
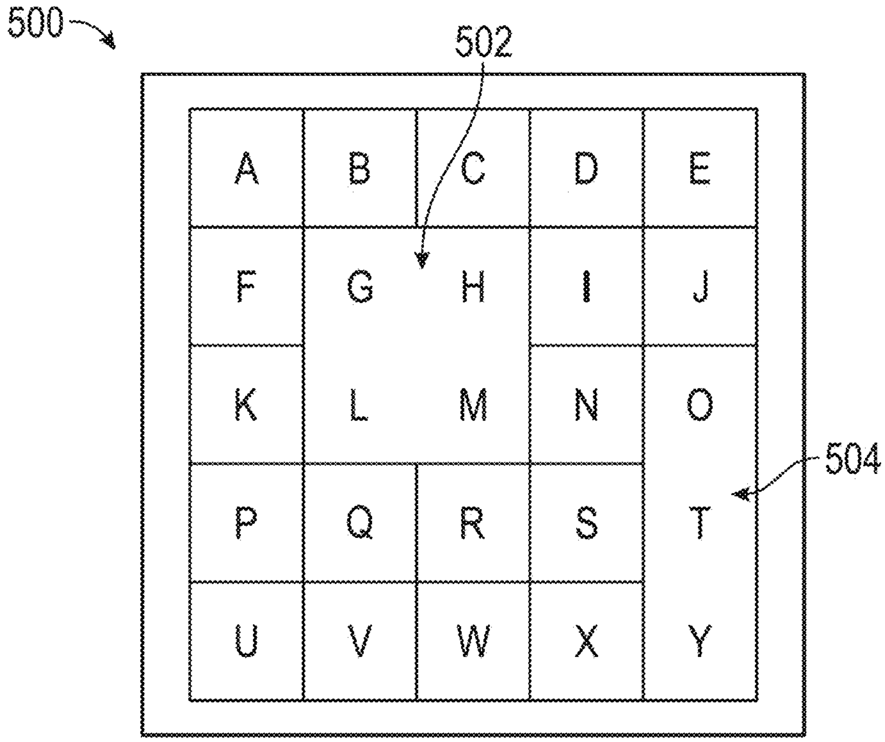
FIG. 5 is a schematic illustration of a reconfiguration sensor network of the top integrated circuit die, according to an embodiment.

FIG. 5 illustrates a schematic reconfigurable sensor network, according to an embodiment. A sensor network 500 may be reconfigured to increase the security of the sensor network. As the memory banks A-Y are addressable, the sensor network 500 may recombine adjacent memory banks to form a new memory bank. For example, the memory banks G, H, L, and M may be recombined into a memory bank 502. The memory banks O, T, and Y may also be combined into another memory bank 504. The recombined memory banks can be configured to detect areas of different sizes and locations and can enhance the robustness of the detection capability of the sensor network 500.

Figure 6:
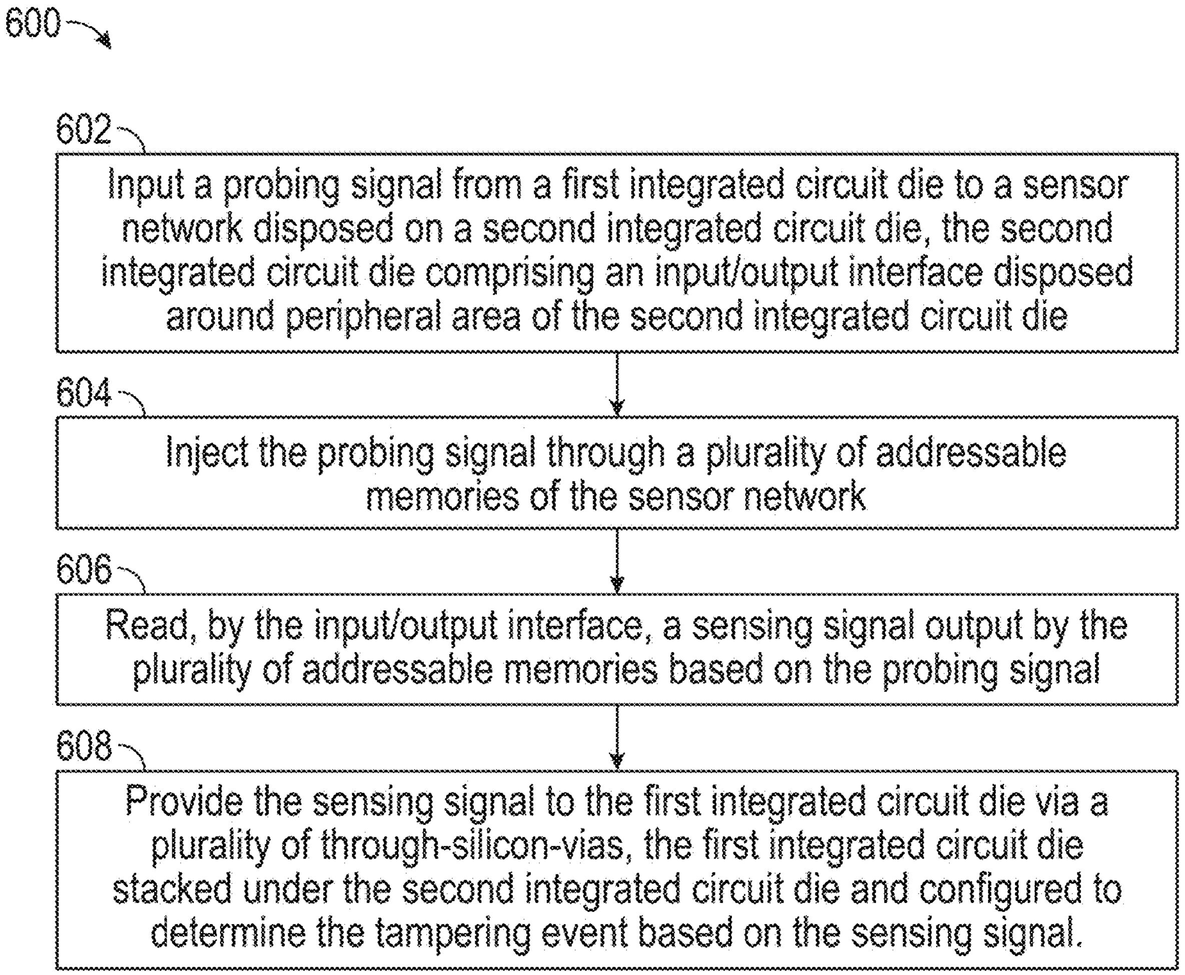
FIG. 6 is a flow diagram of a method for sensing a tampering event of an integrated circuit die stack, according to an embodiment.

FIG. 6 illustrates a method 600 for detecting tampering activities against an IC die stack, according to an embodiment. Control signals, such as read and write, originate and end in the input/output interface of the bottom die 102. At operation 602, the bottom IC die 102 transmits a probing signal to a sensor network 150 disposed on a top IC die 110. The top IC die 110 includes an input/output interface disposed around a peripheral area of the top IC die. The top IC die 110 includes a sensor network 150, where each sensor may be individually addressable and may be a memory bank. At operation 604, the probing signal is routed through a plurality of addressable memory banks of the sensor network 150, which generate a plurality of sensing signals. At operation 606, the input/output interference of the top IC die 110 reads a sensing signal output by the plurality of addressable memory banks. According to an embodiment, the input/output interface of the top IC die 110 may input probing signals to or read sensing signals from a memory bank in two opposite directions and attach a column address and a row address to the sensing signals.

At operation 608, the input/output interface of the top IC die 110 provides the sensing signals to the bottom IC die 102 via a plurality of through-silicon-vias. The bottom IC die 102 is stacked below the top IC die 110 and configured to determine any tampering event based on the sensing signals. The sensing signals include values and addresses of the memory banks. The bottom die stores a data map showing the stored values and corresponding addresses of the memory banks of the sensor network 150. When a memory bank is subjected to a physical attack, the data stored in the memory bank may be lost or altered. When a breached memory bank is being probed, the lost or altered data will be included in the sensing signal. The altered data is subsequently identified once the data included in the sensing signal is compared with the original data map. The row and column addresses corresponding to the breached memory bank indicate a location of a physical attack. According to an embodiment, the sensor network 150 allows the operation of a breached memory bank to affect operations of other memory banks that are connected with the breached memory bank. In this configuration, a physical attack can still be detected even a breached memory bank is not probed in a detecting procedure.

The method 600 may be executed at a reboot and a runtime of a chip package. A reboot may be understood as a restart of a chip package. After the reboot, a chip package generally enters the runtime. During the reboot, the method 600 may probe every memory bank to ensure the security of the entire package. The method 600 may probe a selected set of areas that include sensitive operations or data. The method may not probe other areas that are not active or do not contain sensitive operations. The method 600 may reassign data to the sensor network 150 or reconfigure the sensor network 150 as shown in FIG. 5 to enhance the security of a chip package. During the runtime, the method 600 may simply read the sensing signals from selected memory banks to save power and avoid imposing a heavy computing burden on the chip package.

The method 600 may further include operations to notify the detection of a tampering event to a controller of a higher level. The method 600 may further include operations to initiate a series of security actions, including turning off all input/output, forcing a power cycle to reset, and any other suitable actions.

Figure 7A:
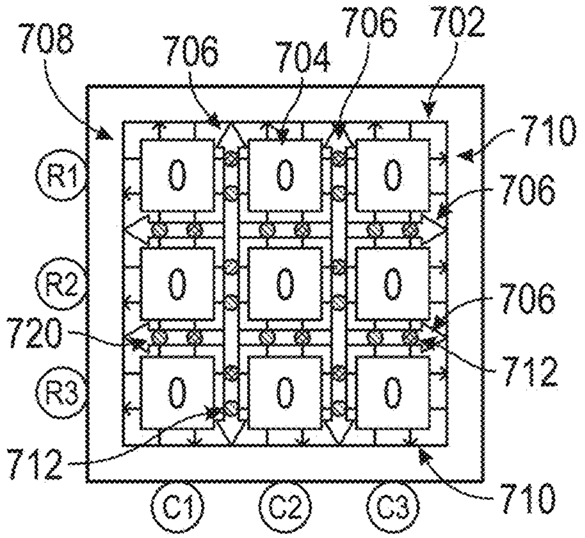
FIGS. 7*a*-7*c* illustrate data created by various operations and stored in the memories of the top integrated circuit die according to an embodiment.
Figure 7B:
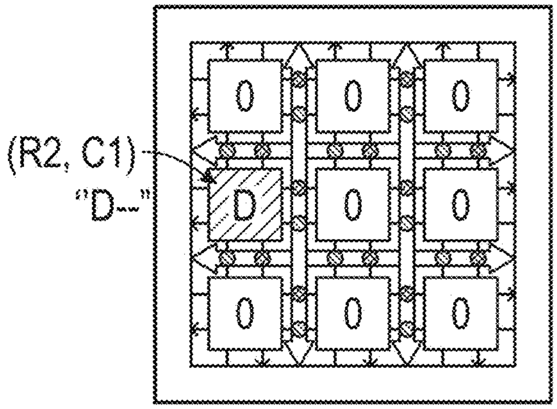
Figure 7C:
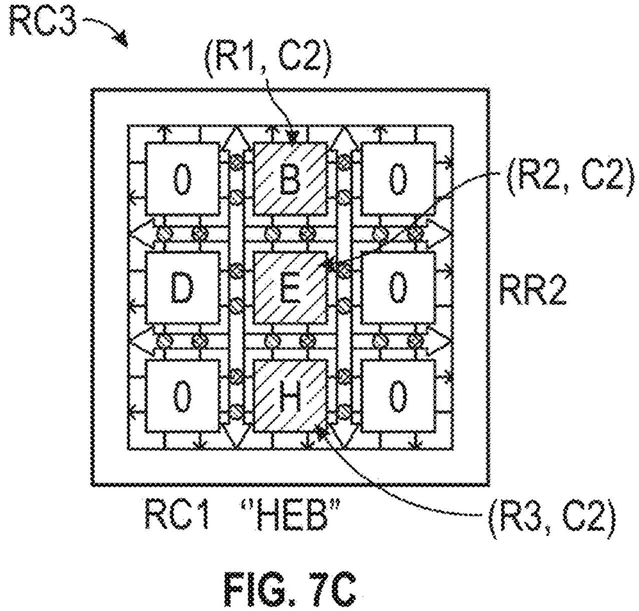

FIGS. 7*a*-7*c* illustrate data stored in a sensor network that are generated by various operations according to an embodiment. An array of nine (9) memory banks 704 of the sensor network 702 are arranged in three (3) rows R1, R2, R3 and three (3) columns C1, C3, C3. The sensor network 102 includes a communication network 720 for bank to die transmission and bank to bank transmission. The bank to die transmission includes an array of two-direction pipelines 706 that couple the memory banks 704 with the input/output interface 708. The sensor network 102 includes a plurality of bank to bank connections 710 that interconnect the memory banks. For each row or column of memory banks, the bank to bank connections 710 include two respective data paths that can transmit data unidirectionally from one side of the row or column to the other side of the row or column. The bank to bank connections 710 couple with the pipelines 706 at access points 712. In this configuration, the input/output interface 708 can read data from or write data into memory banks 704 via the pipelines 706, the access points 712, and the bank to bank connections 710. The read and/or write operation can be initiated from either side of the sensor network 702.

FIG. 7*a* illustrates an initial data map stored in a sensor network 702. Each memory bank has an initial value of "0." In FIG. 7*b*, the sensor network 702 receives a write command of "D—," from the left side of row R2. The command indicates writing "D" to the first memory bank of row R2 and skipping the other two memory banks. As a result, the memory bank with the address (R2, C1) stores "D," while other memory banks store "0." In FIG. 7*c*, the sensor network 702 receives a write command of "HEB," from the bottom side of column C2. The command indicates sequentially writing "HEB" to the three memory banks of column C2. As a result, the memory banks (R3, C2), (R2, C2), and (R1, C2) in column C2 stores "H," "E," and "D," respectively.

Once the data map of FIG. 7*c* is created, the bottom die may read the data stored in the sensor network 702 to detect a tampering event. The bottom die may read the data from either side of the sensor network 702 or from any memory bank of the sensor network 702. For example, a read command RC1 may be transmitted to the bottom side of column C1 to sequentially read the memory banks in column C1. As a result, the sensing signal will include data "0D0." In another example, a read command RR2 may be transmitted to the right side of row R2 to sequentially read the memory banks in row R2. As a result, the sensing signal will include data "OED." In yet another example, a read command RC3 may be transmitted to the top side of column C2 to selectively read the memory banks (R1, C2) and (R3, C2) in row R2. As a result, the sensing signal will include data "B—H," while the data stored in the memory bank (R2, C2) is not read.

Figure 8A:
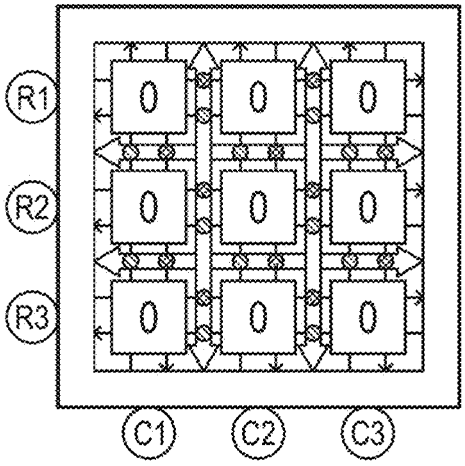
FIGS. 8*a*-8*f* illustrate data created by various operations and stored in the memories of the top integrated circuit die according to an embodiment.
Figure 8D:
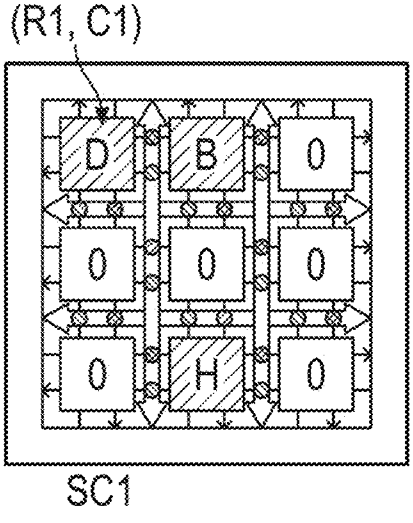
Figure 8B:
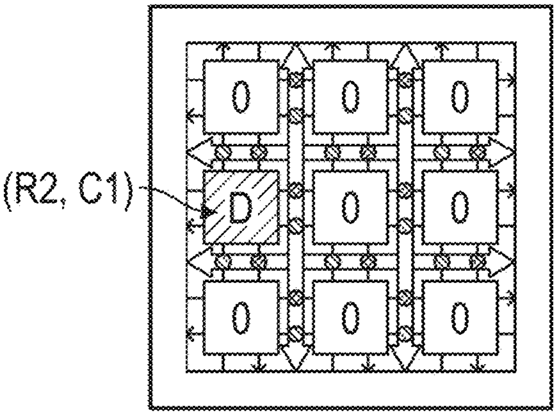
Figure 8E:
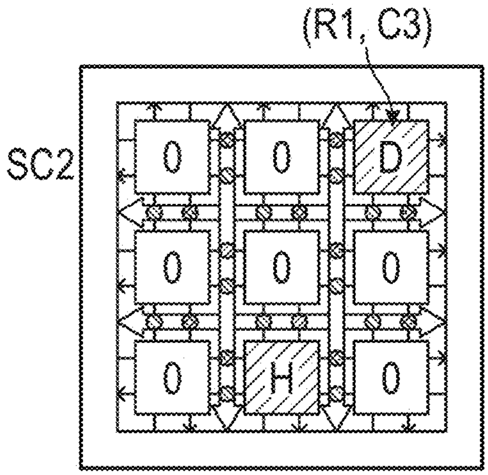
Figure 8C:
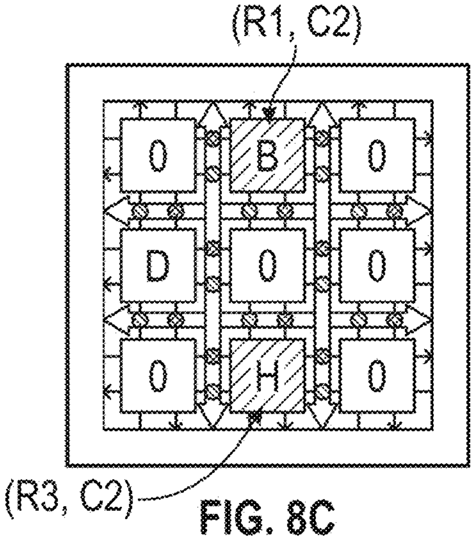

FIGS. 8*a*-8*f* illustrate data stored in a sensor network that are generated by various operations according to an embodiment. The sensor network in FIG. 8*a* is configured similarly as the sensor network in FIG. 7*a*. Each memory bank has an initial value of "0." In FIG. 8*b*, the data "D" is written into the memory bank (R2, C1). In FIG. 8*c*, the data "H" and "B" are written into memory banks (R1, C2) and (R3, C2), respectively. In FIG. 8*d*, a shift command SC1 is transmitted to the bottom side of C1, which shifts data in column C1 to the upper side by one bank. As a result, the data "D" is moved to the memory bank (R1, C1) while the other two memory banks have a value of "0." In FIG. 8*e*, a shift command SC2 is transmitted to the left side of row R1, which shifts data in row R1 to the right side by two banks. As a result, the data "D" is moved to the memory bank (R1, C3) while the other two memory banks have a value of "0." In FIG. 8*f*, a shift command SC3 is transmitted to the right side of column C3, which shifts data in column C3 to the left side by one bank. As a result, the data "H" is moved to the memory bank (R3, C1) while the other two memory banks have a value of "0."

Figure 8F:
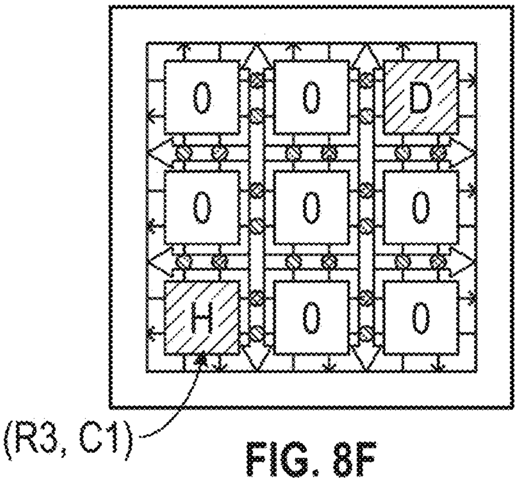

The shifting commands as shown in FIGS. 8*d*, 8*e*, and 8*f* can be implemented to dynamically change the data map of the sensor network during runtime. Comparing to a static data map, a dynamic data map can enhance the security of the sensing system. When the data map is updated, the bottom die stores a copy of the updated data map and utilizes the updated data map to determine whether a tampering event has occurred. To avoid false positive, the bottom die may require the detection of a tampering event to exceed a threshold times or a threshold area before a determination is made. For example, a breach of a minimum number of three (3) consecutive memory banks may be required in order to determine a tampering event. The breach may need to be detected for more than five (5) times or longer than one (1) second in order to determine a tampering event.

While the foregoing is directed to embodiments of the present invention, other and further embodiments of the invention may be devised without departing from the basic scope thereof, and the scope thereof is determined by the claims that follow.

What is claimed is:

1. An integrated circuit die stack comprising:

a first integrated circuit die comprising a plurality of addressable memories coupled to a common output; and a second integrated circuit die stacked below the first integrated circuit die and including functional circuitry configured to analyze sensing signals generated by the plurality of addressable memories through the common output to obtain information about a physical tamper of the plurality of addressable memories.

2. The integrated circuit die stack according to claim 1, wherein the plurality of addressable memories are arranged across a layer parallel to a plane of a top surface of the first integrated circuit die.

3. The integrated circuit die stack according to claim 2, wherein the plurality of addressable memories are arranged in an array, and the addressable memories in a same row or column are serially connected.

4. The integrated circuit die stack according to claim 2, wherein at least one of the plurality of addressable memories comprises a plurality of shift registers.

5. The integrated circuit die stack according to claim 4, wherein the plurality of shift registers are connected in parallel.

6. The integrated circuit die stack according to claim 5, wherein each shift register comprises a plurality of serially connected flip-flops.

7. The integrated circuit die stack according to claim 6, wherein each shift register comprises a first input operable to receive a clock signal, a second input operable to receive a data signal, a third input operable to receive an activation signal, and a tri-state buffer coupled with the activation signal.

8. The integrated circuit die stack according to claim 1, wherein a plurality of through-silicon-vias are coupled with the first integrated circuit die and the second integrated circuit die, the plurality of through-silicon-vias configured to at least partially route sensing signals between the functional circuitry and the plurality of addressable memories.

9. The integrated circuit die stack according to claim 8, further comprising a third integrated circuit die disposed between the first integrated circuit die and the second integrated circuit die.

10. The integrated circuit die stack according to claim 8, wherein the first integrated circuit die further comprises a first reading circuitry disposed in a first peripheral area of the first integrated circuit die.

11. The integrated circuit die stack according to claim 10, wherein the second integrated circuit die further comprises a second reading circuitry disposed in a second peripheral area of the second integrated circuit die.

12. The integrated circuit die stack according to claim 11, wherein the first reading circuitry and the second reading circuitry are coupled with the plurality of through-silicon-vias.

13. The integrated circuit die stack according to claim 10, wherein the first reading circuitry is configured to read the plurality of addressable memories along one direction.

14. The integrated circuit die stack according to claim 13, wherein the first reading circuitry is configured to read the plurality of addressable memories along two opposite directions.

15. A method for detecting a tampering event of an integrated circuit die stack, comprising:

transmitting a probing signal from a second integrated circuit die to a plurality of addressable memories coupled to a common output disposed in a first integrated circuit die, the first integrated circuit die comprising an input/output interface disposed around a peripheral area of the first integrated circuit die and connected to the common output of the plurality of addressable memories;

reading, by the input/output interface, a sensing signal output by the plurality of addressable memories through the common output, the sensing signal generated based on the probing signal; and providing the sensing signal to the second integrated circuit die via a plurality of through-silicon-vias, the second integrated circuit die stacked below the first integrated circuit die and configured to determine the tampering event based on the sensing signal.

16. The method according to claim 15, wherein inputting the probing signal to the plurality of addressable memories occurs during a reboot of the integrated circuit die stack.

17. The method according to claim 16, wherein inputting the probing signal to the plurality of addressable memories occurs during a runtime of the integrated circuit die stack.

18. The method according to claim 15, wherein the input/output interface reads the sensing signal in two opposite directions.

19. The method according to claim 15, further comprising:

determining a location of the tampering event based on the sensing signal.

20. The method according to claim 15, further comprising:

attaching a column address and/or a row address to the sensing signal.

* * * * *